(12) United States Patent
Ma

(10) Patent No.: US 8,423,867 B2
(45) Date of Patent: Apr. 16, 2013

(54) ADVANCED DATA ENCODING WITH REDUCED ERASURE COUNT FOR SOLID STATE DRIVES

(75) Inventor: Xudong Ma, North York (CA)

(73) Assignee: Empire Technology Development LLC, Wilmington, DE (US)

(*) Notice: Subject to any disclaimer, the term of this patent is extended or adjusted under 35 U.S.C. 154(b) by 57 days.

(21) Appl. No.: 13/059,808

(22) PCT Filed: Oct. 29, 2010

(86) PCT No.: PCT/US2010/054634
§ 371 (c)(1),
(2), (4) Date: Feb. 18, 2011

(87) PCT Pub. No.: WO2012/057777
PCT Pub. Date: May 3, 2012

(65) Prior Publication Data
US 2012/0110418 A1    May 3, 2012

(51) Int. Cl.
*G11C 29/00* (2006.01)
(52) U.S. Cl.
USPC .......................................................... 714/773
(58) Field of Classification Search .................. 714/763, 714/773
See application file for complete search history.

(56) References Cited

U.S. PATENT DOCUMENTS

| | | | |
|---|---|---|---|
| 5,742,934 A | 4/1998 | Shinohara | |
| 5,873,112 A | 2/1999 | Norman | |
| 6,069,827 A | 5/2000 | Sinclair | |
| 6,492,918 B1 | 12/2002 | Rezzi et al. | |
| 6,933,864 B1 | 8/2005 | Buch et al. | |
| 6,973,613 B2 * | 12/2005 | Cypher | 714/773 |
| 7,907,070 B2 * | 3/2011 | Wu et al. | 341/60 |
| 2008/0294965 A1 | 11/2008 | Ni et al. | |
| 2010/0070735 A1 | 3/2010 | Chen et al. | |
| 2010/0194607 A1 | 8/2010 | Smith | |

FOREIGN PATENT DOCUMENTS

EP    1424631 B1    3/2006

OTHER PUBLICATIONS

Aritome, et al. "Reliability Issues of Flash Memory Cells," May 1993, Proceedings of the IEEE, 81(5):776-788.
International Search Report dated Dec. 14, 2010 in International Serial No. PCT/US10/54634.
Olson and Langlois, "Solid State Drives Data Reliability and Lifetime," [http://www.csee.umbc.edu/~squire/images/ssd1.pdf] Apr. 7, 2008, pp. 1-27.
Heegard, C., "Partitioned Linear Block Codes for Computer Memory with 'stuck-at' Defects," IEEE Transactions on Information Theory, vol. 29, No. 6, Nov. 1983, pp. 831-842.
Heegard, C. and El-Gamal, A., "On the Capacity of Computer Memory with Defects," IEEE Transactions on Information Theory, vol. 29, No. 5, Sep. 1983, pp. 731-739.
Yaakobi et al., "Error Characterization and Coding Schemes for Flash Memories," pp. 1-5, Proc. Workshop on the Application of Communication Theory to Emerging Memory Technologies, Miami, Florida, Dec. 2010.
Wei, M. et al., "Reliably Erasing Data From Flash-Based Solid State Drives," [http://cseweb.ucsd.edu/users/swanson/papers/Fast2011SecErase.pdf] pp. 1-13, Fast 11 (2011).
Kuznetsov, A.V. et al., "Coding in a memory with Defective Cells," Probl. Peredachi Inf., 1974, 10:2, 52-60.

* cited by examiner

*Primary Examiner* — Shelly A Chase
(74) *Attorney, Agent, or Firm* — Hope Baldauff Hartman, LLC

(57) ABSTRACT

Technologies are generally described herein for encoding a message. Technologies are also generally described herein for decoding an encoded message. The message may be encoded and/or decoded according to a mapping rule. The mapping rule may enable multiple messages to be successively written to the same block in a solid state drive without an erasure operation.

24 Claims, 10 Drawing Sheets

$$H_1 = \begin{bmatrix} 1 & 0 & 0 & 0 & 0 \\ 0 & 1 & 0 & 1 & 0 \\ 0 & 0 & 1 & 0 & 0 \\ 0 & 0 & 0 & 0 & 1 \end{bmatrix}$$

Fig. 3A $$H_2 = \begin{bmatrix} 1 & 0 & 0 & 0 \\ 0 & 1 & 0 & 1 \end{bmatrix}$$

Fig. 3B $$H_3 = \begin{bmatrix} 1 & 1 & 1 & 1 \end{bmatrix}$$

Fig. 3C $$\vec{m}_1 = \begin{bmatrix} 1 \\ 1 \\ 0 \\ 0 \end{bmatrix}$$

Fig. 4A $$\vec{m}_2 = \begin{bmatrix} 1 \\ 0 \end{bmatrix}$$

Fig. 4B $$\vec{m}_3 = \begin{bmatrix} 1 \end{bmatrix}$$

Fig. 4C $\vec{x}_1 =$ [1, 1, 0, 0] ←502

*Fig. 5A*

$\vec{x}_2 =$ [1, 0, 1, 0] ←504  [1, 1, 1, 1] ←506  [1, 0, 0, 0] ←508  [1, 1, 0, 1] ←510

*Fig. 5B*

$\vec{x}_3 =$ [0, 0, 0, 1] ←512  [0, 0, 1, 0] ←514  [0, 1, 0, 0] ←516  [0, 1, 1, 1] ←518  [1, 0, 0, 0] ←520  [1, 0, 1, 1] ←522  [1, 1, 0, 1] ←524  [1, 1, 1, 0] ←526

*Fig. 5C*

804A AT LEAST ONE OF
   ONE OR MORE INSTRUCTIONS FOR SELECTING A BLOCK IN A SOLID STATE DRIVE, THE BLOCK CONFIGURED IN A FIRST STATE;
   ONE OR MORE INSTRUCTIONS FOR RECEIVING A MAPPING RULE CORRESPONDING TO THE BLOCK;
   ONE OR MORE INSTRUCTIONS FOR RECEIVING A CONSTRAINT;
   ONE OR MORE INSTRUCTIONS FOR RECEIVING THE MESSAGE;
   ONE OR MORE INSTRUCTIONS FOR IDENTIFYING ONE OR MORE CODEWORDS THAT MAP TO THE MESSAGE ACCORDING TO THE MAPPING RULE;
   ONE OR MORE INSTRUCTIONS FOR IDENTIFYING AN APPLICABLE CODEWORD IN THE CODEWORDS ACCORDING TO THE CONSTRAINT AS APPLIED TO THE BLOCK CONFIGURED IN THE FIRST STATE; OR
   ONE OR MORE INSTRUCTIONS FOR PERFORMING A WRITE OPERATION OF THE APPLICABLE CODEWORD TO THE BLOCK IN THE SOLID STATE DRIVE, THEREBY TRANSFORMING THE BLOCK FROM THE FIRST STATE TO A SECOND STATE,

*Fig. 8B*

804B AT LEAST ONE OF
   ONE OR MORE INSTRUCTIONS FOR READING AN APPLICABLE CODEWORD FROM A BLOCK IN A SOLID STATE DRIVE;
   ONE OR MORE INSTRUCTIONS FOR RETRIEVING A MAPPING RULE CORRESPONDING TO THE BLOCK; OR
   ONE OR MORE INSTRUCTIONS FOR IDENTIFYING THE MESSAGE THAT MAPS TO THE CODEWORD ACCORDING TO THE MAPPING RULE.

*Fig. 8C*

ADVANCED DATA ENCODING WITH REDUCED ERASURE COUNT FOR SOLID STATE DRIVES

BACKGROUND

Unless otherwise indicated herein, the materials described in this section are not prior art to the claims in this application and are not admitted to be prior art by inclusion in this section.

Each cell in a freshly erased block of a solid state drive may begin at a highest voltage state. Conventionally, each successive write operation to the block can reduce the voltage state of the cells but cannot increase the voltage state of the cells. In order to increase the voltage state of the cells, an erasure operation can be performed on the block where the cells in the block are modified back to the highest voltage state. However, a solid state drive can handle only a limited number of erasure operations in the drive's lifetime, thereby reducing the applicability of solid state drives in implementations where frequent erasure operations can be expected.

SUMMARY

The present disclosure generally describes some methods for encoding a message. According to some example methods, a block may be selected in a solid state disk. The block may be configured in a first state. A mapping rule corresponding to the block, a constraint, and a message may be received. One or more codewords that map to the message may be identified according to the mapping rule. An applicable codeword in the codewords may be identified according to the constraint as applied to the block configured in the first state. A write operation of the applicable codeword to the block in the solid state drive may be performed, thereby transforming the block from the first state to a second state.

The present disclosure generally describes some computer storage media. Some example computer storage media may include computer-executable instructions stored thereon for some methods which, when executed by a computer, adapt the computer to encode a message. According to some example methods, the computer may be configured to perform one or more of the following operations. The computer may read an applicable codeword from a block in a solid state drive. The computer may retrieve a mapping rule corresponding to the block. The computer may identify the message that maps to the codeword according to the mapping rule.

The present disclosure generally describes some computer systems configured to encode a message. Some example computer systems may be configured to include a processor, a memory coupled to the processor, and an encoding unit. The encoding unit may be adapted to execute in the processor from the memory and, when executed by the processor, cause the computer system to encode a message by performing one or more of the following operations. The computer system may select a block in the solid state drive. The block may be configured in a first state. The computer system may receive a first mapping rule corresponding to the block, a constraint, and a first message. The computer system may identify one or more first codewords that map to the first message according to the first mapping rule. The computer system may identify a first applicable codeword in the first codewords according to the constraint as applied to the block configured in the first state. The computer system may perform a write operation of the first applicable codeword to the block in the solid state drive, thereby transforming the block from the first state to a second state. The computer system may receive a second mapping rule corresponding to the block and a second message. The computer system may identify one or more second codewords that map to the second message according to the second mapping rule. The computer system may identify a second applicable codeword in the second codewords according to the constraint as applied to the block configured in the second state. The computer system may perform the write operation of the second applicable codeword to the block in the solid state drive, thereby transforming the block from the second state to a third state.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIGS. 3A-3C show illustrative examples of matrices adapted as input into a mapping rule;

FIGS. 4A-4C show illustrative examples of messages that can be written to a solid state drive;

FIGS. 5A-5C show illustrative examples of codewords adapted to satisfy the mapping rule according to matrices and messages;

FIGS. 8A-8C are schematic diagrams illustrating a computer program product, all arranged according to at least some embodiments presented.

DETAILED DESCRIPTION

Figure 1:
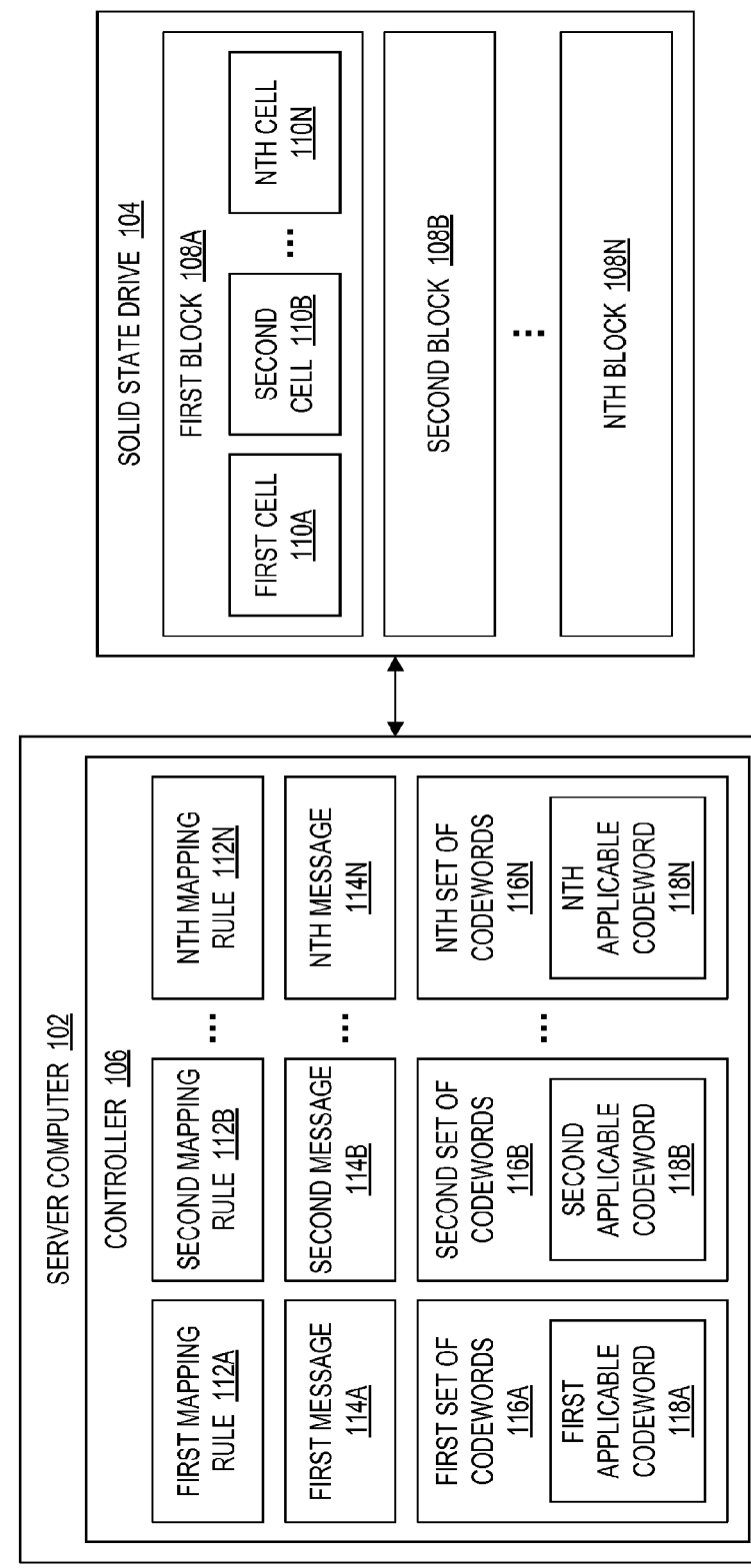
FIG. 1 is a functional block diagram illustrating an example operating environment for encoding a message.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawing, inter alia, to technologies configured to encode a message. In various embodiments, new information can be written into a previously written block without performing an erasure operation on the block. In an illustrative implementation, a user may desire to write a first message to a freshly erased block. A first mapping rule may be adapted to map the first message to a first set of one or more codewords. A controller may identify, from the first set of codewords, a first applicable codeword that satisfies a constraint, such as a down-flipping constraint and a low-voltage-level-cost constraint. Instead of writing the first message to the block, the controller may write the first applicable codeword to the block. When the first applicable codeword is read from the block, the controller may also decode the first applicable codeword back into the first message via the first mapping rule.

When the first message becomes obsolete, the user may then desire to write a second message to the block. A second mapping rule may be adapted to map the second message to a second set of one or more codewords. The controller may identify, from the second set of codewords, a second applicable codeword that satisfies the constraint. In contrast to conventional implementations, the controller may write the second applicable codeword to the block without performing an erasure operation on the block. When the second applicable codeword is read from the block, the controller may also decode the second applicable codeword back into the second message via the second mapping rule.

Turning now to FIG. 1, a functional block diagram illustrates an example operating environment 100 for encoding a message, in accordance with at least some embodiments presented herein. The operating environment 100 may include a computer 102 coupled to a solid state drive 104. The computer 102 may include a controller 106. The controller 106 may be configured to write messages to and read messages from the solid state drive 104. As used herein, a message may refer to any suitable collection of data that can be written to or read from the solid state drive 104.

The solid state drive 104 may include a multiple blocks, including a first block 108A, a second block 108B, and an Nth block 108N. The blocks 108A-108N may be collectively referred to as blocks 108. Each block 108 may include multiple cells. For example, the first block 108A may include a first cell 110A, a second cell 110B, and an Nth cell 110N. The cells 110A-110N may be collectively referred to as cells 110. Each cell 110 may be configured to take multiple states, such as voltage levels. In some embodiments, each cell 110 may be configured to store two voltage levels: a high voltage level and a low voltage level. In some other embodiments, each cell 110 may be configured to store more than two voltage level. Each voltage level may represent a bit value. For example, in the two-state implementation, the high voltage level may represent a binary one, and the low voltage level may represent a binary zero. In some embodiments, the voltage levels may correspond to real numbers representing ratios of a voltage level of cells in the block. For example, the codewords can be 0.92, 0.83, 0.7510333, and 0.63. In this case, the voltage level of the first cell may be set to 0.92 v, the voltage level of the second cell may be set to 0.83 v, the voltage level of the third cell may be set to 0.7510333 v, and the voltage level of the fourth cell may be set to 0.63 v, where v may represent a predetermined voltage level.

The controller 106 may include multiple mapping rules, including a first mapping rule 112A, a second mapping rule 112B, and an Nth mapping rule 112N. The mapping rules 112A-112N may be collectively referred to as mapping rules 112. The controller 106 may be configured to apply the appropriate mapping rule 112 in order to encode messages into one or more corresponding codewords. The controller 106 may also be configured to apply the appropriate mapping rule 112 in order to decode codewords into the corresponding messages. For example, a first message 114A may map to a first set of one or more codewords 116A via the first mapping rule 112A. A second message 114B may map to a second set of one or more codewords 116B via the second mapping rule 112B. An Nth message 114N may map to an Nth set of one or more codewords 116N. The messages 114A-114N may be collectively referred to as messages 114. The sets of codewords 116A-116N may be collectively referred to as codewords 116.

The controller 106 may be further configured to identify, from within the codewords 116, applicable codewords that satisfy a constraint, such as a down-flipping constraint and a low-voltage-level-cost constraint. For example, the first set of codewords 116A may include a first applicable codeword 118A that satisfies the constraint. The second set of codewords 116B may include a second applicable codeword 118B that satisfies the constraint. The Nth set of codewords 116N may include an Nth applicable codeword 118N that satisfies the constraint. The applicable codewords 118A-118N may be collectively referred to as applicable codewords 118. The down-flipping constraint may specify that a write operation can maintain or reduce voltage levels of the cells 110, but cannot increase voltage levels of the cells 110. The applicable codewords 118 may enable the controller 106 to write multiple messages into the blocks 108 of the solid state drive 104 between erasure operations.

Figure 2A:
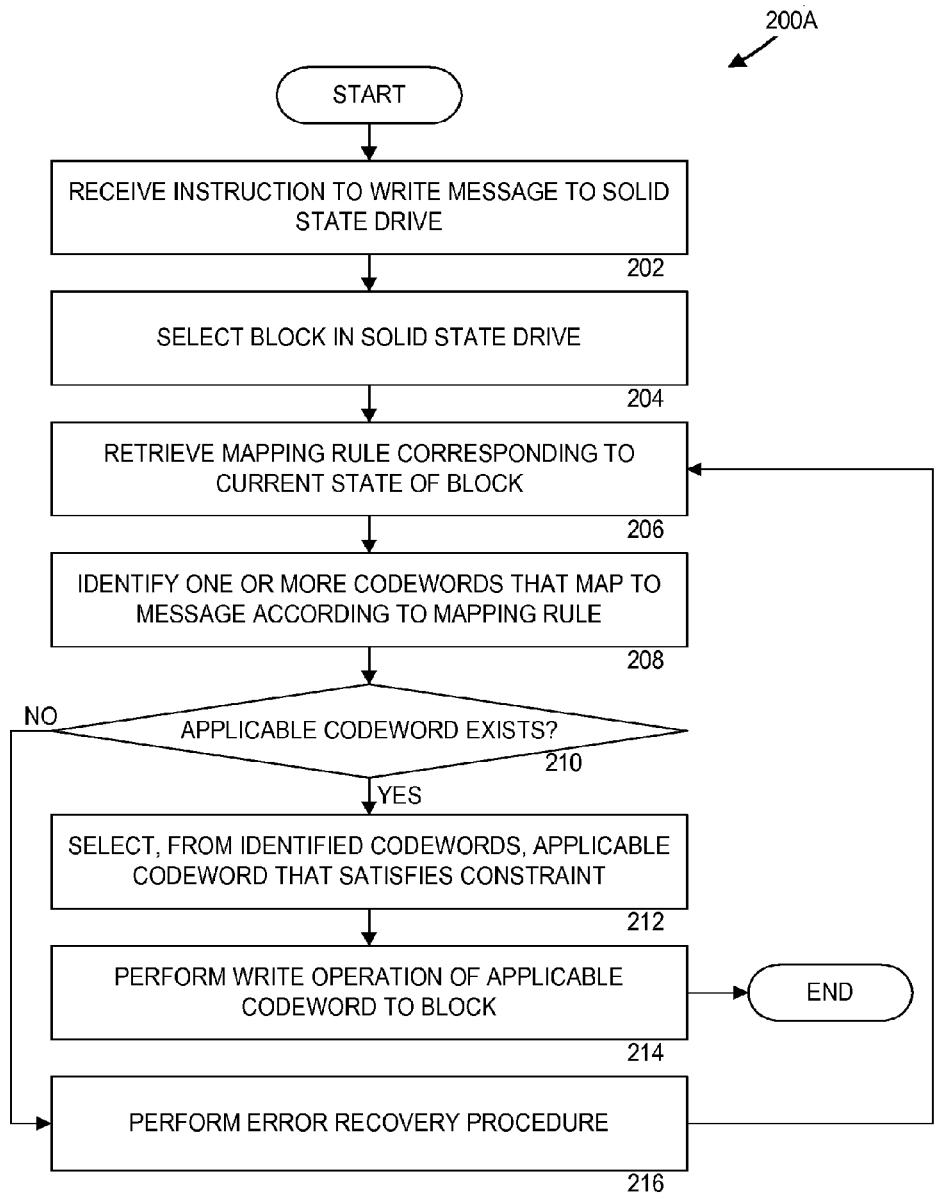
FIG. 2A is a flow diagram illustrating an example process for encoding a message.

Turning now to FIG. 2A, a flow diagram illustrates an example process 200 for encoding a message, in accordance with at least some embodiments described herein. The process 200A may include various operations, functions, or actions as illustrated by one or more of blocks 202-216. The process 200A may begin at block 202 (Receive Instruction), where the controller 106 may be configured to receive an instruction to write a message, such as one of the messages 114, to the solid state drive 104. The message may include any suitable collection of data that can be stored on the solid state drive 104. In some embodiments, the message may be a column vector of binary values. A computer, such as the server computer 102, may provide the instruction to the controller 106. Block 202 may be followed by block 204.

At block 204 (Select Block in Solid state drive), the controller 106 may be configured to select a block, such as one of the blocks 108, from the solid state drive 104. The block may be selected according to any suitable strategy. In one example, the block may be selected according to a predefined sequence. In another example, the block may be selected according to a predefined pattern. In yet another example, the block may be selected randomly or pseudo-randomly. Block 204 may be followed by block 206.

At block 206 (Retrieve Mapping Rule), the controller 106 may be configured to retrieve a mapping rule, such as one of the mapping rules 112. The mapping rule may be selected based on a state of the selected block. In some embodiments, each round of information recording on the selected block may correspond to a different mapping rule 112 (e.g., N mapping rules may correspond to N rounds of information recording). In some other embodiments, each round of information recording on the selected block may correspond to the one or more mapping rules 112 (e.g., a single mapping rule may correspond to N rounds of information recording). Each round of information recording may represent a successive write operation without an erasure operation. For example, the first mapping rule 112A may be selected when the selected block is freshly erased during a first round of information recording. The second mapping rule 112B may be selected after the selected block has been written once during a second round of information recording. The Nth mapping rule 112N may be selected after the selected block has been written N−1 times during an Nth round of information recording.

In some embodiments, each mapping rule 112 may define a matrix, H, adapted to satisfy the following syndrome coding equation: $H\vec{x}=\vec{m}$ mod 2, where $\vec{x}$ represents the codeword, $\vec{m}$ represents the message, and "mod" represents the modulo operation. In some embodiments, each mapping rule 112 may define a different matrix. For example, the first mapping rule 112A may utilize a first matrix, the second mapping rule 112B may utilize a second matrix, and the Nth mapping rule 112N may utilize an Nth matrix. In some other embodiments, the mapping rules 112 may share one or more matrices. The codeword, $\vec{x}$, may represent a binary string. One or more codewords may satisfy the syndrome coding equation for any given message.

In some embodiments, a single mapping rule 112 may correspond to an error correction-based mapping rule. The error correction-based mapping rule may utilize various low-density parity-check code and low-density generator-matrix code encoding and decoding processes. The error correction-based mapping rule may also utilize a joint low-density parity-check code and low-density generator-matrix code encoding and decoding process. The single mapping rule 112 may be utilized for multiple rounds of information recording. The single mapping rule 112 may correspond to multiple codewords. In this case, an applicable codeword may be selected from the multiple codewords according to a low-voltage-level-cost constraint. Block 206 may be followed by block 208.

At block 208 (Identify One or More Codewords), the controller 106 may be configured to identify one or more codewords that map to the message. The codewords may represent encodings of the message. In some embodiments, the controller 106 may determine the codewords by applying the syndrome coding equation as previously described. Block 208 may be followed by block 210.

At block 210 (Determine If Applicable Codeword Exists), the controller 106 may be configured to determine whether the identified codewords contain an applicable codeword that satisfies a constraint with respect to the selected block. In some embodiments, the constraint may be a low-voltage-level-cost constraint. The low-voltage-level-cost constraint may specify that a write operation minimize a total voltage level reduction in the block. That is, the low-voltage-level cost constraint may correspond to the smallest difference between the previous total voltage level before the write operation and the current total voltage level after the write operation. In some other embodiments, the constraint may be a down-flipping constraint. The down-flipping constraint may specify that the write operation maintains or reduces voltage levels of the cells in the selected block.

For example, the selected block may be configured as [1,1,0,0]. That is, the selected block may include four cells. The first and second cells may be configured in a high voltage level representing a binary one. The third and fourth cells may be configured in a low voltage level representing a binary zero. Some identified codewords corresponding to a given message may include $[1,0,1,0]^t$, $[1,1,1,1]^t$, and $[1,0,0,0]^t$. The superscript t may represent a transpose. In this example, the first codeword $[1,0,1,0]^t$ may not satisfy the down-flipping constraint because the third cell in the selected block is currently in a low voltage level and cannot be "flipped up" to a high voltage level to store the first codeword. Similarly, the second codeword $[1,1,1,1]^t$ may not satisfy the down-flipping constraint because the third and fourth cells in the selected block are currently in a low voltage level and cannot be "flipped up" to the high voltage level to store the second codeword. In contrast to the first codeword and the second codeword, the third codeword $[1,0,0,0]^t$ may satisfy the down-flipping constraint because each cell of the selected block either maintains or decreases its voltage level to store the third codeword.

If the controller 106 determines that an applicable codeword does not exist within the identified codewords, then block 210 may be followed by block 216. If the controller 106 determines that an applicable codeword exists within the identified codewords, then block 210 may be followed by block 212.

At block 212 (Select Applicable Codeword), the controller 106 may be configured to select the applicable codeword that satisfies the constraint. In the previous example, the controller 106 may select the third codeword $[1,0,0,0]^t$ because the third codeword satisfies the down-flipping constraint with respect to the current configuration [1,1,0,0] of the selected block.

In some embodiments, the controller 106 may be configured to reverse the applicable codeword, as necessary, to satisfy a low-voltage-level-cost constraint. The low-voltage level-cost-constraint may specify that the applicable codeword should reduce the voltage levels of as few cells as possible. For example, the selected block may be configured as [1,1,1,1]. The applicable codeword corresponding to a given message may be $[1,0,0,0]^t$. If the controller 106 writes the applicable codeword, as is, to the selected block, then the voltage levels of three of the four cells of the selected block may be reduced.

In this case, the controller 106 may be configured to reverse the applicable codeword from $[1,0,0,0]^t$ to $[0,1,1,1]^t$. In this way, when the controller 106 writes the reversed applicable codeword to the selected block, the voltage level of only one of the four cells of the selected block may be reduced. When the controller 106 reads the reverse applicable codeword from the selected block, the controller 106 may be configured to convert the reversed applicable codeword back to the applicable codeword prior to decoding. Block 212 may be followed by block 214.

At block 214 (Write Applicable Codeword), the controller 106 may be configured to write the selected applicable codeword to the selected block in the solid state drive 104. By writing the selected applicable codeword to the selected block in the solid state drive 104, the controller 106 may transform the selected block from one state into another state. In the previous example, the selected block may be initially configured as [1,1,0,0]. If the controller 106 writes the third codeword $[1,0,0,0]^t$ to the selected block, then the controller 106 may transform the selected block from a current configuration of [1,1,0,0] into a new configuration of [1,0,0,0]. After block 214, the process 200A may either repeat (e.g., periodically, continuously, or on demand as needed) or terminate.

At block 216 (Perform Error Recovery Procedure), the controller 106 may be configured to perform an error recovery procedure when the controller 106 determines that the applicable codeword does not exist in block 210. In some embodiments of the error recovery procedure, the controller 106 may be configured to perform an erasure operation on the selected block. By performing an erasure operation on the selected block, the controller 106 may configure each cell in the selected block back to the highest voltage level. In some other embodiments of the error recovery procedure, the controller 106 may select another block in the solid state drive 104. When the controller 106 performs the error recovery procedure, block 216 may be followed by block 206.

Figure 2B:
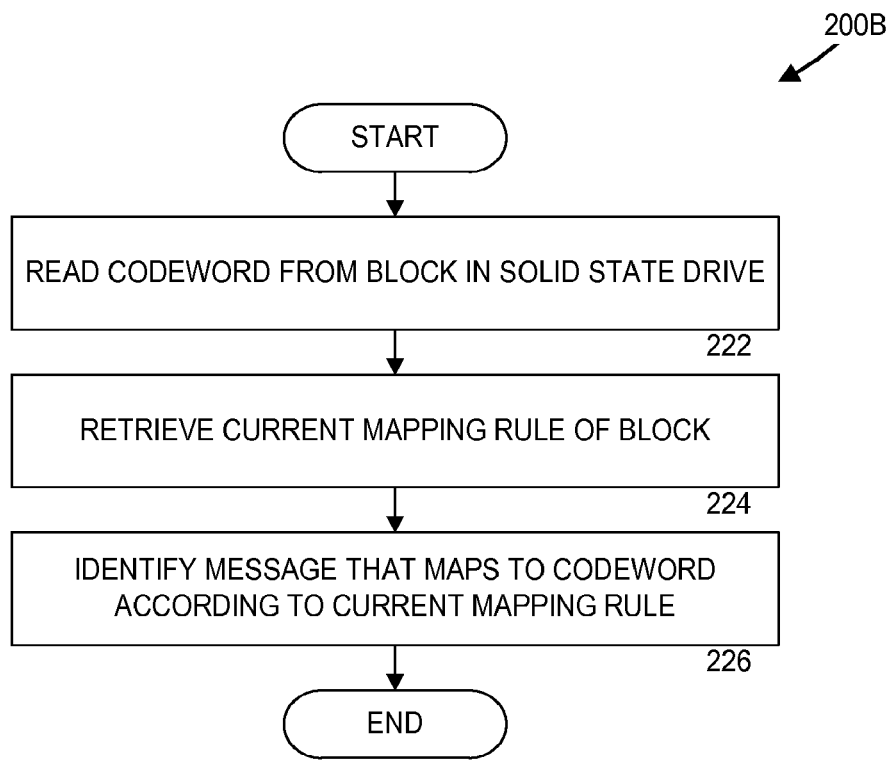
FIG. 2B is a flow diagram illustrating an example process for decoding an encoded message.

Turning now to FIG. 2B, a flow diagram illustrates an example process 200 for decoding an encoded message, in accordance with at least some embodiments described herein. The process 200B may include various operations, functions, or actions as illustrated by one or more of blocks 222-226. The process 200B may begin at block 222 (Read Codeword), where the controller 106 may be configured to read a codeword from a block, such as one of the blocks 108. Block 222 may be followed by block 224.

At block 224 (Retrieve Current Mapping Rule), the controller 106 may be configured to retrieve the current mapping rule associated with the read block. As previously described, the current mapping rule associated with the read block may depend on the current state of the block. In some embodiments, the current mapping rule associated with the read block may correspond to the current round of information recording. Block 224 may be followed by block 226.

At block 226 (Identify Message), the controller 106 may be configured to identify the message that corresponds to the retrieved codeword according to the current mapping rule. After block 226, the process 200B may either repeat (e.g., periodically, continuously, or on demand as needed) or terminate.

Turning now to FIGS. 3A-3C, 4A-4C, and 5A-5C, an illustrative implementation of the mapping rule is shown by way of some examples, in accordance with at least some embodiments presented herein. In the examples shown in FIGS. 3A-3C, 4A-4C, and 5A-5C, the illustrative mapping rule may correspond to the syndrome coding equation, $H\vec{x}=\vec{m}$ mod 2, as previously described. FIGS. 3A-3C show some illustrative examples of matrices $H_1$, $H_2$, $H_3$ adapted as input into the mapping rule. FIGS. 4A-4C show some illustrative examples of messages $\vec{m}_1$, $\vec{m}_2$, $\vec{m}_3$ that can be written to the solid state drive 104. FIGS. 5A-5C show some illustrative examples of codewords, $\vec{x}_1$, $\vec{x}_2$, $\vec{x}_3$, adapted to satisfy the mapping rule in accordance with the matrices $H_1$, $H_2$, $H_3$ and the messages $\vec{m}_1$, $\vec{m}_2$, $\vec{m}_3$, respectively.

FIG. 3A shows a first matrix 302 that can be utilized in a first round of information recording. FIG. 4A shows a first message 402. FIG. 5A shows a codeword 502. In an illustrative example, the controller 106 may receive an instruction to write the first message 402 to a block, such as the first block 108A, in the solid state drive 104. Prior to the first round of information recording, the first block 108A may begin as a freshly erased block. For example, each cell 110 in the first block 108A may be configured to a highest voltage level representing a binary one. The first block 108A may be configured as [1,1,1,1] prior to the first round of information recording.

Upon receiving the instruction from the controller 106 to write the first message 402 to the first block 108A, the controller 106 may retrieve a first mapping rule corresponding to the equation $H_1\vec{x}_1=\vec{m}_1$ mod 2. The controller 106 may be configured to identify values of the codeword $\vec{x}_1$ that satisfy the equation. In this example, a single codeword 502 may satisfy the equation given the first matrix 302 and the first message 402. Because the first block 108A is freshly erased, any binary string, including the codeword 502, may satisfy the down-flipping constraint. As a result, the controller 106 may be configured to perform a write operation to record the codeword 502 on the first block 108A. In light of this write operation, the first block 108A may be transformed from current configuration of [1,1,1,1] into a new configuration of [1,1,0,0].

When the controller 106 receives an instruction to read the first block 108A, the controller 106 may read the encoded message [1,1,0,0] from the first block 108. Upon reading the encoded message [1,1,0,0] from the first block 108, the controller 106 may retrieve the current mapping rule. In this case, the current mapping rule may be the first mapping rule corresponding to the equation $H_1\vec{x}_1=\vec{m}_1$ mod 2. The controller 106 may decode the encoded message [1,1,0,0] back to the first message 402 in accordance with the first mapping rule.

FIG. 3B shows a second matrix 304 that can be utilized in a second round of information recording. FIG. 4B shows a second message 404. FIG. 5B shows multiple codewords 504-510. In an illustrative example, the first message 402 may become obsolete, and the controller 106 may receive a subsequent instruction to write the second message 404 to the first block 108A. As of a result of the first round of information recording, the first block 108A may be configured as [1,1,0,0] prior to the second round of information recording.

Upon receiving the instruction from the controller 106 to write the second message 404 to the first block 108A, the controller 106 may retrieve a second rule corresponding to the equation $H_2\vec{x}_2=\vec{m}_2$ mod 2. The controller 106 may be configured to identify values of the codeword $\vec{x}_2$ that satisfy the equation. In this example, multiple codewords 504-510 may satisfy the equation given the second matrix 304 and the second message 404. However, the codewords 504, 506, 510 may not satisfy the down-flipping constraint given the current configuration of the first block 108A. That is, each of the codewords 504, 506, 510 may involve improperly increasing the voltage level of at least one of the cells 110. The codeword 508 may satisfy the down-flipping constraint. As a result, the controller 106 may be configured to perform a write operation to record the codeword 508 on the first block 108A. In light of this write operation, the first block 108A may be transformed from a current configuration of [1,1,0,0] into a new configuration of [1,0,0,0].

When the controller 106 receives an instruction to read the first block 108A, the controller 106 may read the encoded message [1,0,0,0] from the first block 108. Upon reading the encoded message [1,1,0,0] from the first block 108, the controller 106 may retrieve the current mapping rule. In this case, the current mapping rule may be the second mapping rule corresponding to the equation $H_2\vec{x}_2=\vec{m}_2$ mod 2. The controller 106 may decode the encoded message [1,0,0,0] back to the second message 404 in accordance with the second mapping rule.

FIG. 3C shows a third matrix 306 that can be utilized in a third round of information recording. FIG. 4C shows a third message 406. FIG. 5C shows multiple codewords 512-526. In an illustrative example, the second message 404 may become obsolete, and the controller 106 may receive a subsequent instruction to write the third message 406 to the first block 108A. As of a result of the second round of information recording, the first block 108A may be configured as [1,0,0,0] prior to the third round of information recording.

Upon receiving the instruction from the controller 106 to write the third message 406 to the first block 108A, the controller 106 may retrieve a third rule corresponding to the equation $H_3\vec{x}_3=\vec{m}_3$ mod 2. The controller 106 may be configured to identify values of the codeword $\vec{x}_3$ that satisfy the equation. In this example, multiple codewords 512-526 may satisfy the equation given the third matrix 306 and the third message 406. However, the codewords 512-518 and 522-526 may not satisfy the down-flipping constraint given the current configuration of the first block 108A. That is, each of the codewords 512-518 and 522-526 may involve improperly increasing the voltage level of at least one of the cells 110. The codeword 520 may satisfy the down-flipping constraint. As a result, the controller 106 may be configured to perform a write operation to record the codeword 508 on the first block 108A. In light of this write operation, the first block 108A may remain configured as [1,0,0,0].

When the controller 106 receives an instruction to read the first block 108A, the controller 106 may read the encoded message [1,0,0,0] from the first block 108. Upon reading the encoded message [1,1,0,0] from the first block 108, the controller 106 may retrieve the current mapping rule. In this case, the current mapping rule may be the third mapping rule corresponding to the equation $H_3 \vec{x}_3 = \vec{m}_3$ mod 2. The controller 106 may decode the encoded message [1,0,0,0] back to the third message 406 in accordance with the third mapping rule.

Figure 6A:
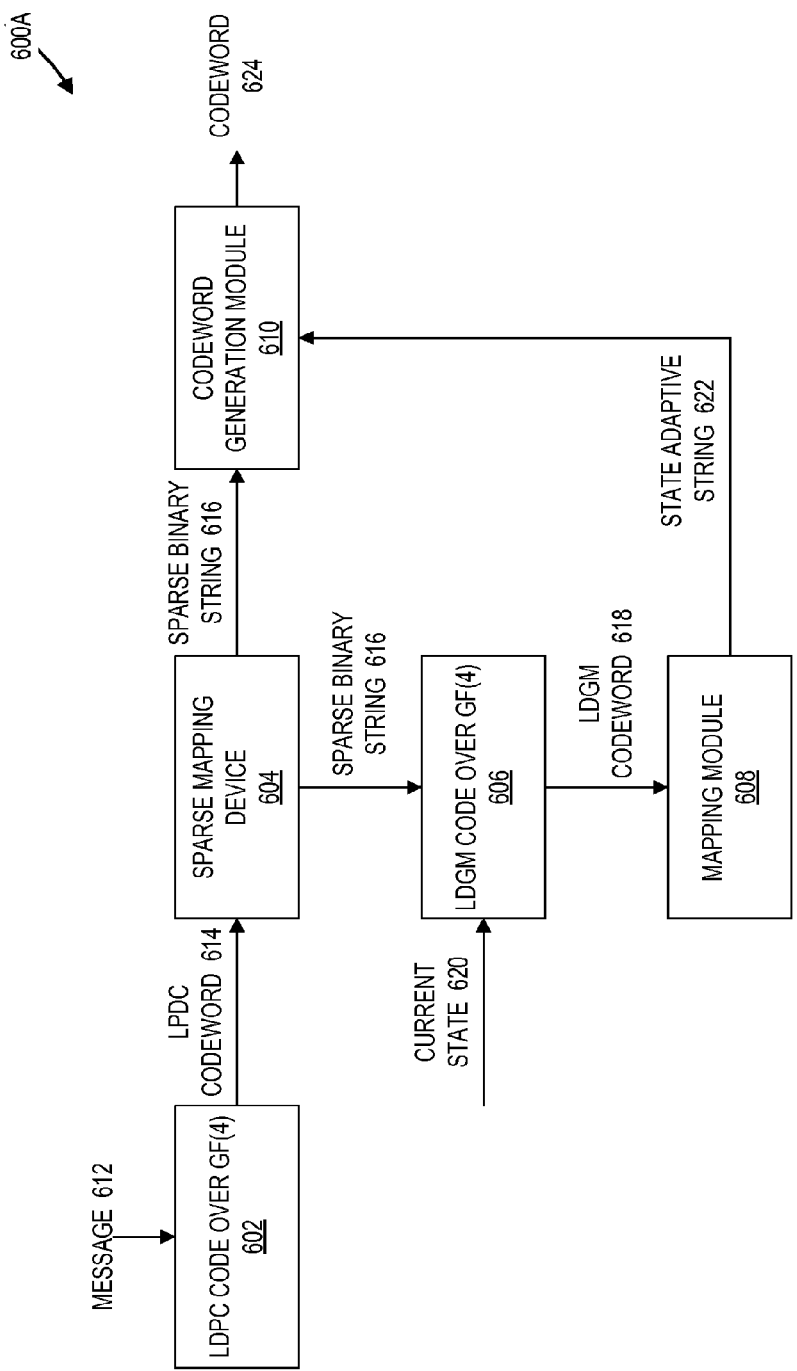
FIG. 6A is a functional block diagram illustrating an example operating environment for encoding a message.

Turning now to FIG. 6A, a functional block diagram illustrates an example operating environment 600A for encoding a message, in accordance with at least some embodiments described herein. The operating environment 600A may include a low-density parity-check ("LDPC") code 602 over a Galois field of order 4 ("GF(4)") 602, a sparse mapping module 604, a low-density generator-matrix ("LDGM") code 606 over GF(4), a mapping module 608, and a codeword generation module 610.

The LDPC code 602 may encode a message 612 into one or more LDPC codewords 614. The LDPC codewords 614 may be represented as a string of symbols in the finite field GF(4). The LDPC code 602 may be defined by a matrix equation $H\vec{x} = \vec{0}$. The codewords encoded by the LDPC code 602 may be vectors $\vec{x}$ satisfying the above matrix equation, where H may be a fixed sparse matrix, elements of H and $\vec{x}$ may be symbols in GF(4), and multiplications and additions may be finite field multiplications and additions in GF(4).

The sparse mapping module 604 may map each LDPC codeword 614 encoded by the LDPC code 602 into a sparse binary string 616. The sparse binary string 616 may be a string of zeros and ones, where there are more zeros than ones. For example, the sparse mapping module 604 may map four symbols in the finite field GF(4) into sparse bit strings 1000, 0100, 0010, and 0001, respectively. The sparse mapping module 604 may map a string of symbols in GF(4) into a concatenation of the sparse strings corresponding to each individual symbol.

The LDGM code 606 may generate one or more LDGM codewords 618 based on the sparse binary string 616 and a current state 620 of the block in the solid state drive. Each LDGM codeword 618 may be represented as a string of GF(4) symbols). The LDGM code 606 may be defined by a matrix equation $\vec{X}_2 = G\vec{X}_1$. The LDGM codewords encoded by the LDGM code 606 may be the vectors $[\vec{X}_1, \vec{X}_2]^t$, where $\vec{X}_1$ and $\vec{X}_2$ may be two vectors satisfying the above matrix equation, G may be a fixed sparse matrix, elements G, $\vec{X}_1$, $\vec{X}_2$ may be symbols in the finite filed GF(4), and multiplications and additions may be finite field multiplications in GF(4). If more than one LDGM codeword 618 is generated, an applicable LDGM codeword 618 may be selected according to a low-voltage-level-cost constraint.

The mapping module 608 may map the LDGM codeword 618 into a string of integers embodied as a state adaptive string 622. Each integer may correspond to a bit value, each of which corresponds to a different voltage level. For example, if each cell in the solid state drive may be configured in one of four voltage, integers 0, 1, 2, 3 may correspond to a first, second, third, and fourth voltage levels, respectively. The codeword generation module 610 may generate a codeword 624 by summing the state adaptive string 622 and the sparse binary string 616.

An example process flow for encoding a message may be described as follows. The LDPC code 602 may receive the message 612. The LDPC code 602 may encode the message 612 into the LDPC codeword 614. The sparse mapping module 604 may map the LPDC codeword 614 into a sparse binary string 616 containing 25% ones and 75% zeros. The LDGM code 606 may observe the current state (i.e., configuration) 620 of the block in the solid state drive and generate the LDGM codeword 618 based on the sparse binary string 616 and the current state 620. The mapping module 608 may map the LDGM codeword 618 into the state adaptive string 622. The resulting codeword 624 generated by the codeword generation module 610 may be modulo four equal to the summation of the sparse binary string 616 and the state adaptive string 622.

Figure 6B:
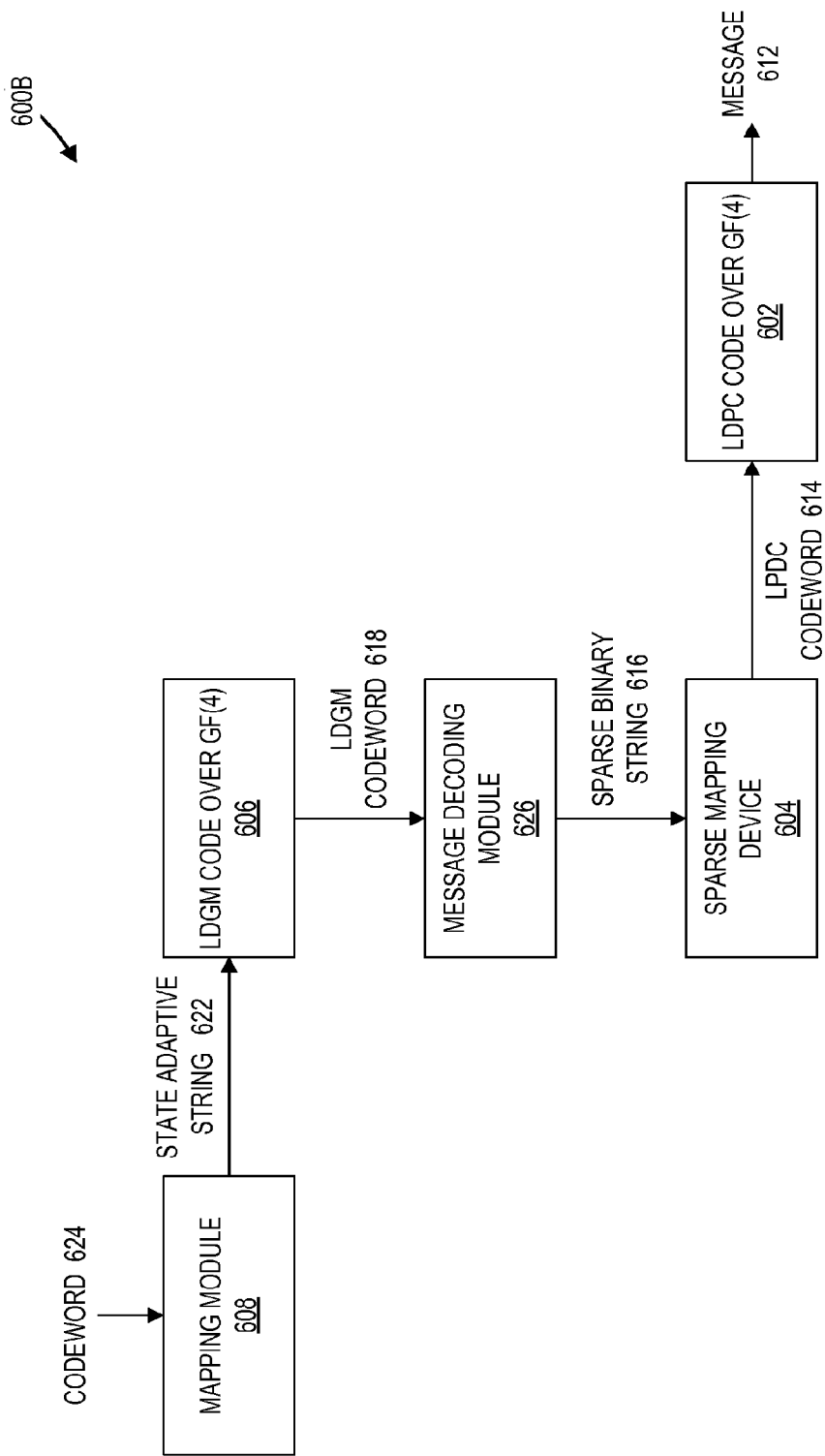
FIG. 6B is a functional block diagram illustrating an example operating environment for decoding a codeword.

Turning now to FIG. 6B, a functional block diagram illustrates an example operating environment 600B for decoding a codeword, in accordance with at least some embodiments described herein. The operating environment 600B may include the low-density parity-check ("LDPC") code 602 over a Galois field of order 4 ("GF(4)") 602, the sparse mapping module 604, the low-density generator-matrix ("LDGM") code 606 over GF(4), the mapping module 608, and the codeword generation module 610, as described above with respect to FIG. 6A. The operating environment 600B may further include a message decoding module 626.

An example process flow for decoding a codeword may be described as follows. The LDGM code 606 and/or the mapping module 608 may retrieve a codeword 624 from the block of the solid state drive. Because the codeword 624 may be modulo four equal to the summation of the sparse binary string 616 and the state adaptive string 622, the codeword 624 may be considered as a noise corrupted version of the state adaptive string 622 with 25% of symbols flipped. The mapping module 608 and the LDGM code 606 may utilize various error correction technologies to recover the state adaptive string 622 and the LDGM codeword 618, respectively. The message decoding module 626 may subtract the state adaptive string 622 from the LDGM codeword 618 to obtain the sparse binary string 616. The sparse mapping module 604 may then map the sparse binary string 616 to the LDPC codeword 614. The LDPC code 602 may obtain the message 612 from the LDPC codeword 614.

Figure 7:
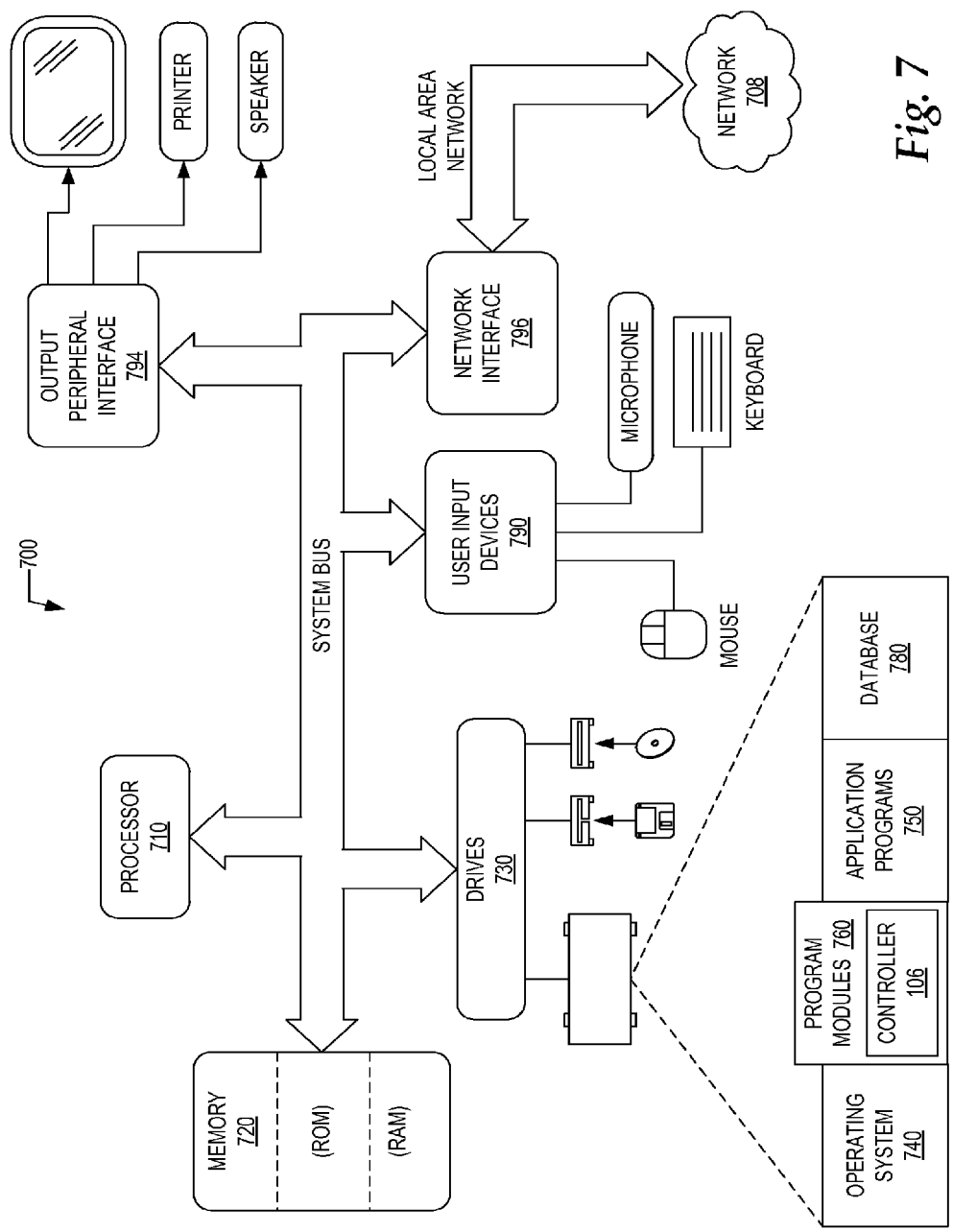
FIG. 7 is a block diagram illustrating an example computing system.

FIG. 7 is a computer architecture diagram showing an illustrative computer hardware architecture for an example computing system capable of implementing at least some embodiments presented herein. FIG. 7 includes a computer 700, including a processor 710, memory 720 and one or more drives 730. The computer 700 may be implemented as a conventional computer system, an embedded control computer, a laptop, or a server computer, a mobile device, a set-top box, a kiosk, a vehicular information system, a mobile telephone, a customized machine, or other hardware platform.

The drives 730 and their associated computer storage media, provide storage of computer readable instructions, data structures, program modules and other data for the computer 700. The drives 730 can include an operating system 740, application programs 750, program modules 760, and a database 780. The program modules 760 may include the controller 106. The controller 106 may be adapted to execute the process 200A for encoding a message and/or the process 200B for decoding an encoded message as described in greater detail above with reference to FIGS. 2A-2B. The computer 700 further includes user input devices 790 through which a user may enter commands and data. Input devices can include an electronic digitizer, a microphone, a keyboard and pointing device, commonly referred to as a mouse, trackball or touch pad. Other input devices may include a joystick, game pad, satellite dish, scanner, or the like.

These and other input devices can be coupled to the processor 710 through a user input interface that is coupled to a system bus, but may be coupled by other interface and bus structures, such as a parallel port, game port or a universal serial bus ("USB"). Computers such as the computer 700 may also include other peripheral output devices such as speakers, which may be coupled through an output peripheral interface 794 or the like.

The computer 700 may operate in a networked environment using logical connections to one or more computers, such as a remote computer coupled to a network interface 796. The remote computer may be a personal computer, a server, a router, a network PC, a peer device or other common network node, and can include many or all of the elements described above relative to the computer 700. Networking environments are commonplace in offices, enterprise-wide area networks ("WAN"), local area networks ("LAN"), intranets, and the Internet.

When used in a LAN or WLAN networking environment, the computer 700 may be coupled to the LAN through the network interface 796 or an adapter. When used in a WAN networking environment, the computer 700 typically includes a modem or other means for establishing communications over the WAN, such as the Internet or the network 708. The WAN may include the Internet, the illustrated network 708, various other networks, or any combination thereof. It will be appreciated that other mechanisms of establishing a communications link, ring, mesh, bus, cloud, or network between the computers may be used.

According to some embodiments, the computer 700 may be coupled to a networking environment. The computer 700 may include one or more instances of a physical computer-readable storage medium or media associated with the drives 730 or other storage devices. The system bus may enable the processor 710 to read code and/or data to/from the computer-readable storage media. The media may represent an apparatus in the form of storage elements that are implemented using any suitable technology, including but not limited to semiconductors, magnetic materials, optical media, electrical storage, electrochemical storage, or any other such storage technology. The media may represent components associated with memory 720, whether characterized as RAM, ROM, flash, or other types of volatile or nonvolatile memory technology. The media may also represent secondary storage, whether implemented as the storage drives 730 or otherwise. Hard drive implementations may be characterized as solid state, or may include rotating media storing magnetically-encoded information.

The storage media may include one or more program modules 760. The program modules 760 may include software instructions that, when loaded into the processor 710 and executed, transform a general-purpose computing system into a special-purpose computing system. As detailed throughout this description, the program modules 760 may provide various tools or techniques by which the computer 700 may participate within the overall systems or operating environments using the components, logic flows, and/or data structures discussed herein.

The processor 710 may be constructed from any number of transistors or other circuit elements, which may individually or collectively assume any number of states. More specifically, the processor 710 may operate as a state machine or finite-state machine. Such a machine may be transformed to a second machine, or specific machine by loading executable instructions contained within the program modules 760. These computer-executable instructions may transform the processor 710 by specifying how the processor 710 transitions between states, thereby transforming the transistors or other circuit elements constituting the processor 710 from a first machine to a second machine. The states of either machine may also be transformed by receiving input from the one or more user input devices 790, the network interface 796, other peripherals, other interfaces, or one or more users or other actors. Either machine may also transform states, or various physical characteristics of various output devices such as printers, speakers, video displays, or otherwise.

Encoding the program modules 760 may also transform the physical structure of the storage media. The specific transformation of physical structure may depend on various factors, in different implementations of this description. Examples of such factors may include, but are not limited to: the technology used to implement the storage media, whether the storage media are characterized as primary or secondary storage, and the like. For example, if the storage media are implemented as semiconductor-based memory, the program modules 760 may transform the physical state of the semiconductor memory 720 when the software is encoded therein. For example, the software may transform the state of transistors, capacitors, or other discrete circuit elements constituting the semiconductor memory 720.

As another example, the storage media may be implemented using magnetic or optical technology such as drives 730. In such implementations, the program modules 760 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. It should be appreciated that various other transformations of physical media are possible without departing from the scope and spirit of the present description.

Figure 8A:
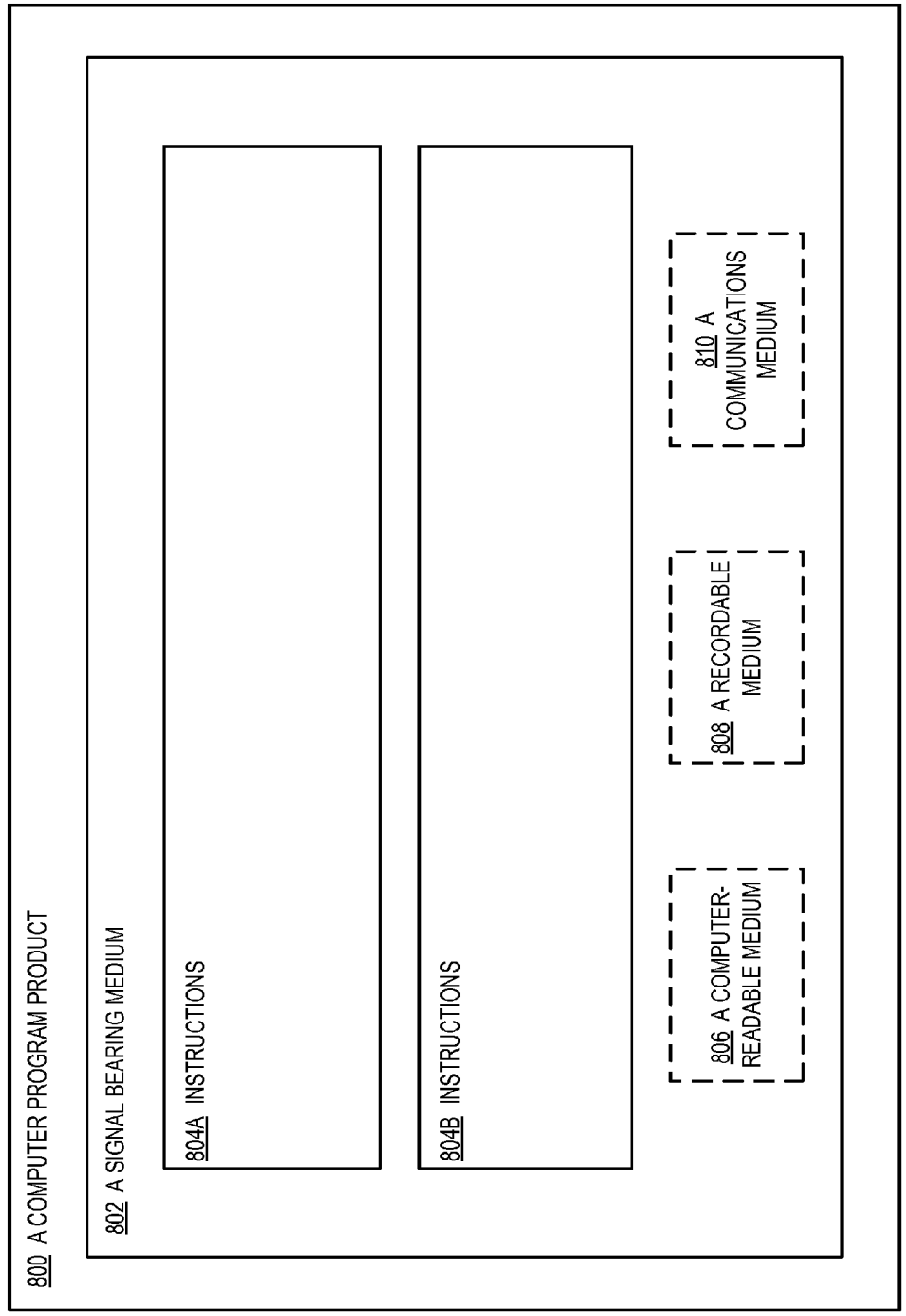

Turning now to FIGS. 8A-8C, schematic diagrams illustrate a partial view of a computer program product 800 that includes a computer program for executing a computer process on a computing device, arranged according to at least some embodiments presented herein. An illustrative embodiment of the example computer program product 800 is provided using a signal bearing medium 802, may include at least one instruction of 804A and/or at least one instruction of 804B. The instructions 804A as illustrated in FIG. 8B may include: one or more instructions for selecting a block in a solid state drive, the block configured in a first state; one or more instructions for receiving a mapping rule corresponding to the block; one or more instructions for receiving a constraint; one or more instructions for receiving the message; one or more instructions for identifying one or more codewords that map to the message according to the mapping rule; one or more instructions for identifying an applicable codeword in the codewords according to the constraint as applied to the block configured in the first state; or one or more instructions for performing a write operation of the applicable codeword to the block in the solid state drive, thereby transforming the block from the first state to a second state The instructions 804B as illustrated in FIG. 8C may include: one or more instructions for reading an applicable codeword from a block in a solid state drive; one or more instructions for retrieving a mapping rule corresponding to the block; or one or more instructions for identifying the message that maps to the codeword according to the mapping rule. The one or more instructions may be, for example, computer executable and/or logic implemented instructions. In some embodiments, the signal bearing medium 802 of the one or more computer program products 800 include a computer readable medium 806, a recordable medium 808, and/or a communications medium 810.

While the subject matter described herein is presented in the general context of program modules that execute in conjunction with the execution of an operating system and application programs on a computer system, those skilled in the art will recognize that other implementations may be performed in combination with other types of program modules. Generally, program modules include routines, programs, components, data structures, and other types of structures that perform particular tasks or implement particular abstract data types. Moreover, those skilled in the art will appreciate that the subject matter described herein may be practiced with other computer system configurations, including hand-held devices, multi-core processor systems, microprocessor-based or programmable consumer electronics, minicomputers, mainframe computers, and the like.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for encoding a message, comprising:
    selecting a block in a solid state drive, the block configured in a first state;
    receiving a mapping rule corresponding to the block;
    receiving a constraint;
    receiving the message;
    identifying one or more codewords that map to the message according to the mapping rule;
    identifying an applicable codeword in the codewords according to the constraint as applied to the block configured in the first state; and
    performing a write operation of the applicable codeword to the block in the solid state drive, thereby transforming the block from the first state to a second state.

2. The method of claim 1, wherein identifying one or more codewords that map to the message according to the mapping rule comprises identifying the codewords that map to the message according to a syndrome coding based mapping rule.

3. The method of claim 1, wherein identifying one or more codewords that map to the message according to the mapping rule comprises identifying the codewords that map to the message according to an error correction based mapping rule.

4. The method of claim 1, wherein the constraint comprises a down-flipping constraint; and wherein identifying an applicable codeword in the codewords according to the constraint as applied to the block configured in the first state comprises identifying the applicable codeword that can be written to the block in the first state while satisfying the down-flipping constraint.

5. The method of claim 4, wherein the down-flipping constraint specifies that the write operation maintains or reduces voltage levels of cells in the block; and wherein each of a plurality of bit values corresponds to one of the voltage levels.

6. The method of claim 4, wherein a higher voltage level in a cell represents a higher bit value; and wherein a lower voltage level in the cell represents a lower bit value.

7. The method of claim 1, wherein the codewords comprise real numbers representing ratios of a voltage level of cells in the block; and wherein each of a plurality of bit values corresponds to one of the ratios of the voltage level.

8. The method of claim 1, wherein the constraint comprises a low-voltage-level-cost constraint; and wherein the low-voltage-level-cost-constraint specifies that the write operation minimizes a total voltage level reduction in the block; and wherein each of a plurality of bit values corresponds to one of the voltage levels.

9. The method of claim 1, further comprising:
    receiving a second mapping rule corresponding to the block;
    receiving a second message;
    identifying one or more second codewords that map to the second message according to the second mapping rule;
    identifying a second applicable codeword in the second codewords according to the constraint as applied to the block configured in the second state; and
    performing the write operation of the second applicable codeword to the block in the solid state drive, thereby transforming the block from the second state to a third state.

10. The method of claim 1, further comprising:
    receiving a second message;
    identifying one or more second codewords that map to the second message according to the mapping rule;
    identifying a second applicable codeword in the second codewords according to the constraint as applied to the block configured in the second state; and
    performing the write operation of the second applicable codeword to the block in the solid state drive, thereby transforming the block from the second state to a third state.

11. The method of claim 1, further comprising:
    reading the applicable codeword from the block in the solid state drive;
    retrieving the mapping rule corresponding to the block; and
    identifying the message that maps to the codeword according to the mapping rule.

12. The method of claim 11, wherein identifying the message that maps to the codeword according to the mapping rule comprises identifying the message according to a syndrome coding based mapping rule.

13. The method of claim 12, wherein the syndrome coding based mapping rule comprises a matrix.

14. The method of claim 1, wherein performing a write operation of the applicable codeword to the block in the solid state drive comprises:
    determining whether the applicable codeword contains a greater number of first bit values than second bit values;
    in response to determining that the applicable codeword contains a greater number of first bit values than second bit values, reversing bit values of the applicable codeword to generate a reversed applicable codeword;
    upon reversing the bit values of the applicable codeword to generate the reversed applicable codeword, performing the write operation of the reversed applicable codeword to the block in the solid state drive; and
    in response to determining that the applicable codeword does not contain a greater number of first bit values than second bit values, performing the write operation of the applicable codeword to the block in the solid state drive.

15. A computer-readable storage medium having computer-executable instructions stored thereon which, when executed by a computer, cause the computer to encode a message by:
    reading an applicable codeword from a block in a solid state drive;
    retrieving a state of the block;
    retrieving a mapping rule corresponding to the state of the block from a plurality of mapping rules;
    identifying the message that maps to the codeword according to the mapping rule.

16. The computer-readable storage medium of claim 15, wherein identifying a message that maps to the codeword according to the mapping rule comprises identifying the message that maps to the codeword according to a syndrome coding based mapping rule.

17. The computer-readable storage medium of claim 15, wherein identifying a message that maps to the codeword according to the mapping rule comprises identifying the message that maps to the codeword according to an error correction based mapping rule.

18. The computer-readable storage medium of claim 15 having further computer-executable instructions stored thereon which, when executed by the computer, cause the computer to encode the message by:
    selecting the block in the solid state drive, the block configured in a first state;
    receiving the mapping rule corresponding to the block;
    receiving a constraint;
    receiving the message;

identifying one or more codewords that map to the message according to the mapping rule;

identifying the applicable codeword in the codewords according to the constraint as applied to the block configured in the first state; and performing a write operation of the applicable codeword to the block in the solid state drive, thereby transforming the block from the first state to a second state.

19. A computer system, comprising:

a processor;

a memory coupled to the processor;

a solid state drive; and an encoding unit which executes in the processor from the memory and, when executed by the processor, causes the computer system to encode a message by selecting a block in the solid state drive, the block configured in a first state;

receiving a first mapping rule corresponding to the block;

receiving a constraint;

receiving a first message;

identifying one or more first codewords that map to the first message according to the first mapping rule;

identifying a first applicable codeword in the first codewords according to the constraint as applied to the block configured in the first state;

performing a write operation of the first applicable codeword to the block in the solid state drive, thereby transforming the block from the first state to a second state;

receiving a second mapping rule corresponding to the block;

receiving a second message;

identifying one or more second codewords that map to the second message according to the second mapping rule;

identifying a second applicable codeword in the second codewords according to the constraint as applied to the block configured in the second state; and performing the write operation of the second applicable codeword to the block in the solid state drive, thereby transforming the block from the second state to a third state.

20. The computer system of claim 19, wherein the first state comprises an erased state after performing an erase operation on the block.

21. The computer system of claim 19, wherein the encoding unit which executes in the processor from the memory and, when executed by the processor, further causes the computer system to encode a message by receiving a third message;

receiving a third mapping rule;

identifying one or more third codewords that map to the third message according to the third mapping rule;

determining whether the third codewords contain a third applicable codeword according to the constraint; and in response to determining that the third codewords contain the third applicable codeword according to the constraint, performing the write operation of the third applicable codeword to the block in the solid state drive, thereby transforming the block from the third state to a fourth state.

22. The computer system of claim 21, wherein in response to determining that the third codewords do not contain the third applicable codeword according to the constraint, performing an error recovery process.

23. The computer system of claim 22, wherein performing an error recovery process comprises selecting another block in the solid state drive.

24. The computer system of claim 22, wherein performing an error recovery process comprises performing an erase operation on the block in the solid state drive, thereby transforming the block from the third state to the first state.

* * * * *

UNITED STATES PATENT AND TRADEMARK OFFICE
CERTIFICATE OF CORRECTION

PATENT NO.       : 8,423,867 B2
APPLICATION NO.  : 13/059808
DATED            : April 16, 2013
INVENTOR(S)      : Ma It is certified that error appears in the above-identified patent and that said Letters Patent is hereby corrected as shown below:

In the Drawings

In Fig. 6A, Sheet 6 of 10, delete "LPDC CODEWORD 614" and insert
-- LDPC CODEWORD 614 --, therefor.

In Fig. 6B, Sheet 7 of 10, delete "LPDC CODEWORD 614" and insert
-- LDPC CODEWORD 614 --, therefor.

In the Specifications

In Column 10, Line 15, delete "LPDC" and insert -- LDPC --, therefor.

In Column 13, Line 4, delete "state" and insert -- state. --, therefor.

Signed and Sealed this
Sixth Day of May, 2014

Michelle K. Lee
*Deputy Director of the United States Patent and Trademark Office*